United States Patent
Auer

(10) Patent No.: US 10,128,811 B2
(45) Date of Patent: Nov. 13, 2018

(54) METHOD FOR OPERATING A SELECTIVE SWITCHING DEVICE FOR SIGNALS

(71) Applicant: Tesat-Spacecom GmbH & Co. KG, Backnang (DE)

(72) Inventor: Erich Auer, Besigheim (DE)

(73) Assignee: TESAT-SPACECOM GMBH & CO KG, Backnang (DE)

( * ) Notice: Subject to any disclaimer, the term of this patent is extended or adjusted under 35 U.S.C. 154(b) by 0 days.

(21) Appl. No.: 15/384,720

(22) Filed: Dec. 20, 2016

(65) Prior Publication Data
US 2017/0179918 A1    Jun. 22, 2017

(30) Foreign Application Priority Data
Dec. 21, 2015  (DE) .......................... 10 2015 016 462

(51) Int. Cl.
| | |
|---|---|
| H03H 7/46 | (2006.01) |
| H04B 1/40 | (2015.01) |
| H03J 3/04 | (2006.01) |
| H03H 7/01 | (2006.01) |
| H03H 11/04 | (2006.01) |
| H03H 11/34 | (2006.01) |
| H03H 17/02 | (2006.01) |
| H03D 7/16 | (2006.01) |

(52) U.S. Cl.
CPC .............. *H03H 7/46* (2013.01); *H03D 7/161* (2013.01); *H03H 7/0138* (2013.01); *H03H 11/04* (2013.01); *H03H 11/34* (2013.01); *H03H 17/0201* (2013.01); *H03J 3/04* (2013.01); *H04B 1/40* (2013.01)

(58) Field of Classification Search
CPC ..... H01P 1/10; H03J 3/04; H03D 7/16; H04B 1/40; H03H 7/46; H03H 11/34

USPC ......................................... 333/101, 103, 104
See application file for complete search history.

(56) References Cited

U.S. PATENT DOCUMENTS

| | | | |
|---|---|---|---|
| 5,428,323 A | 6/1995 | Geissler et al. | |
| 7,764,131 B1 * | 7/2010 | Seth ........................ | H03L 1/027 327/298 |

(Continued)

FOREIGN PATENT DOCUMENTS

| | | |
|---|---|---|
| FR | 2905537 A1 | 3/2008 |
| JP | 3088105 B2 | 9/2000 |

OTHER PUBLICATIONS

German Patent and Trade Mark Office, Office Action in German Patent Application No. 10 2015 016 462.7 dated Sep. 12, 2016.

*Primary Examiner* — Dean Takaoka
(74) *Attorney, Agent, or Firm* — Lorenz & Kopf LLP

(57) ABSTRACT

The disclosure relates to a method for operating a selective switching device for signals, a related selective switching device, and a message transmission system having the selective switching device. An embodiment of the method includes the following steps, not necessarily in this order: determining a current temperature in the region of the selective switching device; determining a signal shift of the selective switching device due to the current temperature; adding the signal shift to an input signal of the selective switching device as to receive a compensated signal for which the signal shift due to the current temperature is compensated; and removing the signal shift from an output signal of the selective switching device as to receive a corrected signal for which the compensation is corrected.

9 Claims, 2 Drawing Sheets

(56) References Cited

U.S. PATENT DOCUMENTS

2002/0022464 A1     2/2002   Uchida et al.
2005/0260961 A1    11/2005   Cowley et al.

* cited by examiner

METHOD FOR OPERATING A SELECTIVE SWITCHING DEVICE FOR SIGNALS

CROSS-REFERENCE TO RELATED APPLICATION

This application claims priority to German patent application number 10 2015 016 462.7, filed Dec. 21, 2015, which is incorporated herein by reference in its entirety.

TECHNICAL FIELD

The disclosure relates to a method for operating a selective switching device for signals, such a selective switching device, and a message transmission system with such a selective switching device.

BACKGROUND

A waveguide filter is a passive filter used in microwave technology in the form of a specifically equipped waveguide. It serves to suppress or to let pass specific frequencies of the electromagnetic wave propagating in the waveguide. Among other things, waveguide filters may be used as an assembly for larger transmitter systems, radar systems, and for communication satellites.

Huge fluctuations in temperature may occur particularly in aerospace applications, which fluctuations in temperature may become effective as intense changes of the volume of waveguide components and waveguide filters. One solution for avoiding temperature dependencies (drift) of waveguide filters is the selection of materials which have a very low temperature expansion coefficient by nature, e.g., invar. However, materials like invar have the drawback that they are heavy-weight, expensive, and difficult to process.

Another solution for avoiding temperature dependencies of waveguide filters is using additional mechanical elements, like bimetal structures which physically compensate the temperature dependent expansion of the waveguide by a temperature dependent deflection of the bimetal structure which deflection is opposite in its effect. For example, German patent document DE 43 19 886 C1 discloses an arrangement for compensating temperature dependent changes of the volume of a waveguide, wherein the waveguide is clamped in a frame, wherein the temperature dependent expansion of the frame is lower than that one of the waveguide. The waveguide is connected to the frame in a force-fitting manner (friction lock) at at least two positions of its wall being arranged opposite to each other and the friction lock connections between the frame and the waveguide are accomplished by distance pieces (spacers) which transfer pressure and tensile forces to the waveguide wall and cause deformation there, wherein the pressure and tensile forces result from a different heat expansion of the frame and the waveguide. Such a mechanic solution is depicted in the following, but has the drawback, among other things, that it is costly in manufacturing and handling.

BRIEF SUMMARY

There may be a need to enable simplified operation of a selective switching device.

It is proposed to provide a method for operating a selective switching device for signals. The method comprises the following steps, not necessarily in this order: determining a current temperature in the region of the selective switching device; determining a signal shift of the selective switching device due to the current temperature; adding the signal shift to an input signal of the selective switching device as to receive a compensated signal for which the signal shift due to the current temperature is compensated; and removing the signal shift from an output signal of the selective switching device as to receive a corrected signal for which the compensation is corrected.

In the first instance, the method for operating a selective switching device for signals according to the present disclosure may accept an occurring temperature dependency or temperature drift. With exemplary reference to a waveguide filter being a selective switching device, the current temperature drift which results in a frequency shift of the filter function may be determined by measuring the current temperature. This frequency shift may be applied to the input signals with the same sign and may be applied to the output signals with opposite sign, and, hence, be compensated finally. In this manner, compensation of the temperature drift of a so called low cost waveguide filter is achieved. Low cost refers to lower costs in comparison to a waveguide filter made of invar, for example. A low cost waveguide filter may be built according to the half shell technique and may be made of aluminum (milled or pressure die-casting) or of plastic in pressure die-casting with subsequent surface metallization.

The method for operating the selective switching device according to the present disclosure may be referred to as "hybrid temperature compensation technique" and enables that low cost waveguide filter can be used without any further technical drawbacks, i.e., a significant cost benefit is achieved without technical drawbacks. The additional expenditure arising by application of the "hybrid temperature compensation technique" in systems is very low as existing arrangements can be used (e.g., controller, synthesizer). The method for operating a selective switching device according to the present disclosure is superior to mechanic solutions (e.g., bimetal structure) as it is less costly in manufacturing and handling.

According to an embodiment, the signal shift is a frequency shift, the input signal is an input spectrum, and the output signal is an output spectrum. Adding the signal shift may be an addition or summation, removing of the signal shift may be a subtraction.

According to an embodiment, the selective switching device is a frequency selective unit or a frequency multiplexer. A multiplexer is a selective switch in analogue and digital electronics, by means of which selective switch an input signal can be selected from a number of input signals and can be connected through to the output. Multiplexer are comparable with rotary switches which are not set manually but with electronic signals. According to an embodiment, the frequency multiplexer is provided in the form of a passive filter, an active filter, a digital filter, or a hybrid form. The passive filter may be a waveguide filter.

According to an embodiment, the signal shift is determined by an approximation calculation. According to an embodiment, the signal shift is determined on the basis of a database.

According to an embodiment, the compensated signal and the corrected signal are synchronously (in chronological terms) updated by the selective switching device in forward direction and reverse direction. From an external point of view, the signal is not distorted or adulterated by the temperature compensation as, in this manner, the shift of the input signal and of the output signal is done at the same time or synchronously. An updating rate of the compensated signal and the corrected signal may be greater than twice of the signal limitation of a change of the current temperature.

According to an embodiment, the method for operating a selective switching device further comprises the following steps, not necessarily in this order: determining a desired signal range of the input signal and/or of the output signal of the selective switching device depending on the operation purpose of the selective switching device; and adding a further signal shift to the input signal and/or to the output signal as to shift the input signal and/or the output signal to the desired signal range.

In other words, additionally to the compensation of the temperature drift of the selective switching device, the signal shift may be used to shift the input signal as well as the output signal to a frequency range which enables realization of the selective switching device as advantageous as possible, e.g. in the form of a passive, or active, or digital filter, or a hybrid form of the same.

It is furthermore proposed to provide a selective switching device which is designed for determining a signal shift of the selective switching device due to a current temperature, for adding the signal shift to an input signal of the selective switching device, and for removing the signal shift from an output signal of the selective switching device, as to compensate the signal shift due to the current temperature in the region of the selective switching device.

According to an embodiment, the steps indicated above are used in the same manner in forward direction and in reverse direction. According to an embodiment, the selective switching device is a network of multiple multiplexers. Determining a current individual temperature in the region of the multiplexer may be accomplished for each multiplexer individually. Also, determining the individual signal shift due to the current individual temperature may be accomplished for each multiplexer individually. Even the compensated individual signal for which the signal shift is compensated due to the current temperature may be received for each multiplexer individually by adding the individual signal shift to an individual input signal of the multiplexer. The corrected individual signal for which the compensation is corrected may likewise be received for each multiplexer individually by removing the individual signal shift from an individual output signal of the multiplexer.

According to an embodiment, the selective switching device is made of a light metal, a light metal alloy, plastic, and/or a fiber-reinforced composite.

It is furthermore proposed to provide a message transmission system which comprises a selective switching device as described above. According to an embodiment, the signal shift is a frequency shift, the input signal is an input spectrum, and the output signal is an output spectrum. According to an embodiment, the selective switching device is a multiplexer. According to an embodiment, the multiplexer is provided in the form of a passive filter, an active filter, a digital filter, or a hybrid form. The passive filter may be a waveguide filter.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Further features, advantages and application possibilities can be derived from the following description of exemplary embodiments and the drawings. Thereby, all described and/or visually depicted features for themselves and in any combination form the subject matter of the disclosure independent of their combination in the individual claims or their dependencies. In the drawings, same reference signs indicate same or similar objects.

DETAILED DESCRIPTION

Figure 1:
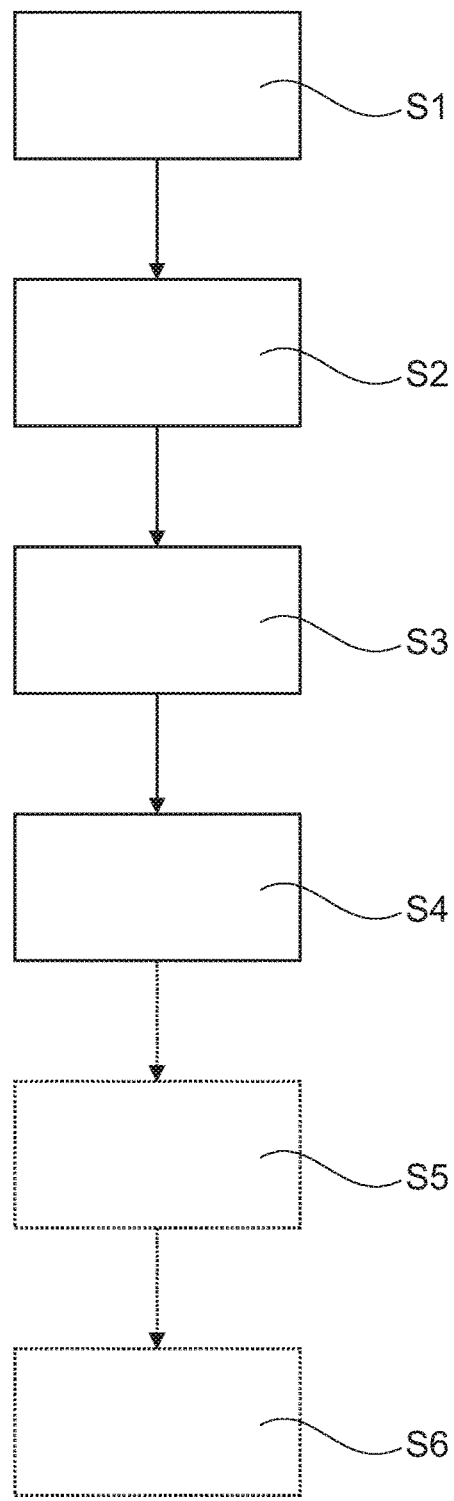
FIG. 1 shows a schematic view of an exemplary method for operating a selective switching device for signals.

FIG. 1 shows a schematic view of an exemplary method for operating a selective switching device for signals. The method comprises the following steps, not necessarily in this order:

Step S1: determining a current temperature in the region of the selective switching device;

Step S2: determining a signal shift of the selective switching device due to the current temperature;

Step S3: adding the signal shift to an input signal of the selective switching device as to receive a compensated signal for which the signal shift due to the current temperature is compensated; and Step S4: removing the signal shift from an output signal of the selective switching device as to receive a corrected signal for which the compensation is corrected.

Furthermore, the method for operating a selective switching device comprises the following optional steps, not necessarily in this order:

Step S5: determining a desired signal range of the input signal and/or of the output signal of the selective switching device depending on the operation purpose of the selective switching device; and Step S6: adding a further signal shift to the input signal and/or to the output signal as to shift the input signal and/or the output signal to the desired signal range.

Here, the selective switching device is a multiplexer in the form of a passive filter, like a waveguide filter, for example. Here, the signal shift is a frequency shift, the input signal is an input spectrum, and the output signal is an output spectrum. The signal shift may be determined by an approximation calculation or on the basis of a database. Here, the compensated signal and the corrected signal are updated synchronously by the multiplexer in forward direction and in reverse direction, so that shifting of the input signal and of the output signal is done at the same time or synchronously, and, from an external point of view, the signal is not distorted or adulterated by the temperature compensation.

By the steps S1 to S4 and with exemplary reference to a waveguide filter being a selective switching device, the current temperature drift which results in a frequency shift of the filter function is determined by measuring the current temperature. This frequency shift may be applied to the input signals of the waveguide filter with the same sign and may be applied to the output signals of the waveguide filter with opposite sign, and, hence, be compensated finally. In this manner, compensation of the temperature drift of a so called low cost waveguide filter made of aluminum or plastic is achieved.

By the steps S5 and S6, additionally to the compensation of the temperature drift of the multiplexer, the signal shift is used to shift the input signal as well as the output signal to a frequency range which enables realization of the multiplexer as advantageous as possible.

Figure 2:
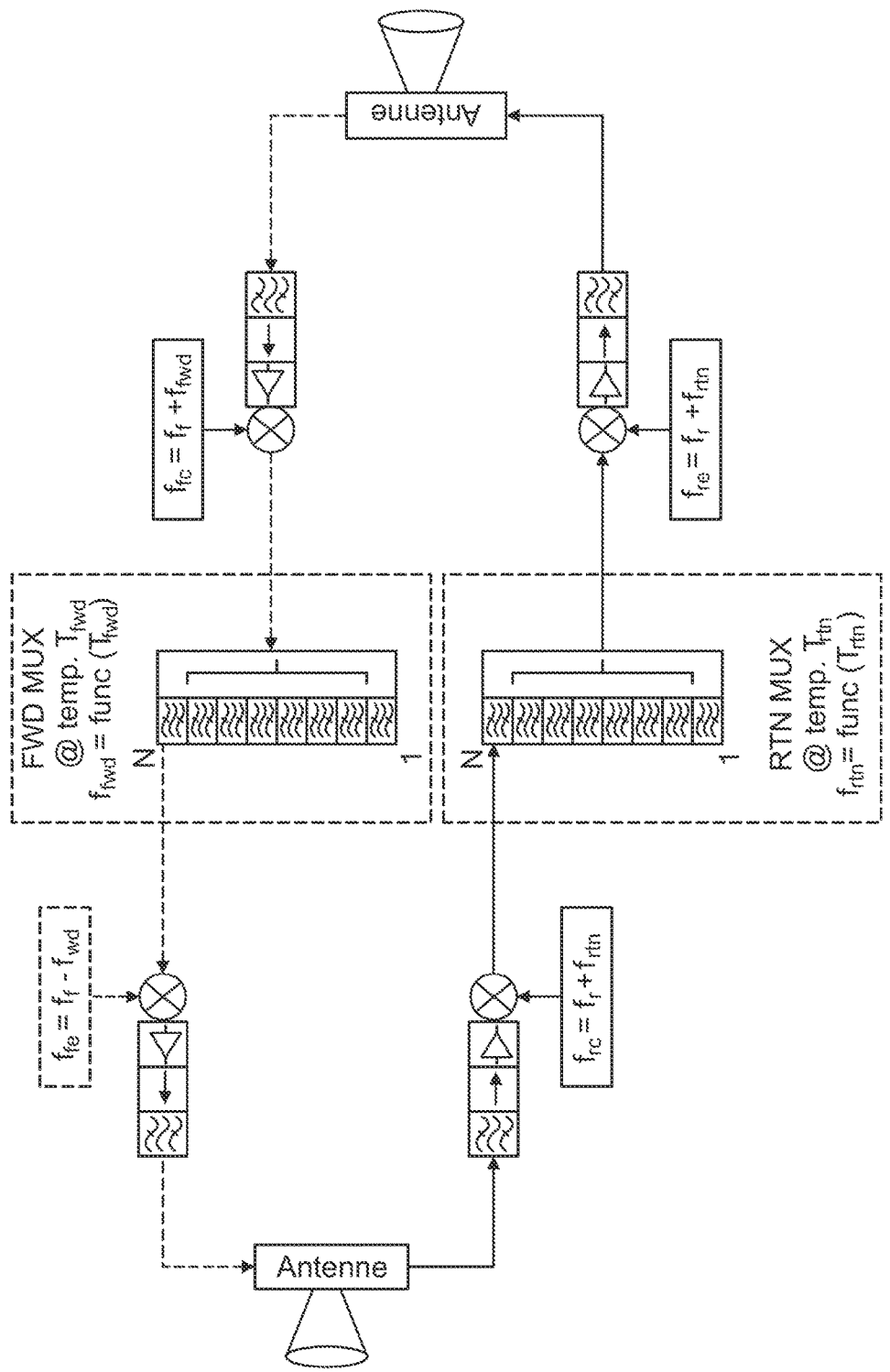
FIG. 2 shows a schematic view of an exemplary block diagram of a message transmission system.

FIG. 2 shows a schematic view of an exemplary block diagram of a message transmission system. The message transmission system comprises multiple multiplexers (MUX) which can be used in forward direction (FWD) and reverse direction (RTN). The frequency shifts ffwd and frtn in forward direction and in reverse direction depend on the current temperatures Tfwd and Trtn in forward direction and in reverse direction. The frequency shifts ffwd and frtn in forward direction and in reverse direction are added or summed to input signals ff and fr in forward direction and in reverse direction as to receive a compensated signal ffc and frc in forward direction and in reverse direction for which compensated signal the signal shift due to the current temperature is compensated. The frequency shifts ffwd and frtn in forward direction and in reverse direction are removed or subtracted from input signals ff and fr in forward direction and in reverse direction as to receive a corrected signal ffe and fre in forward direction and in reverse direction for which corrected signal the compensation is corrected.

Additionally, it is noted that "comprising" does not exclude any other elements or steps and "a" or "an" does not exclude a plurality. It is further noted that features or steps which are described with reference to one of the above exemplary embodiments may also be used in combination with other features or steps of other exemplary embodiments described above. Reference signs in the claims are not to be construed as a limitation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for operating a selective switching device for signals, comprising the steps of:
   determining a current temperature in the region of the selective switching device;
   determining a signal shift of the selective switching device due to the current temperature;
   adding the signal shift to an input signal of the selective switching device as to receive a compensated signal for which the signal shift due to the current temperature is compensated; and
   removing the signal shift from an output signal of the selective switching device as to receive a corrected signal for which the compensation is corrected;
   wherein the compensated signal and the corrected signal are synchronously updated by the selective switching device in forward direction and in reverse direction.

2. The method of claim 1, wherein the signal shift is a frequency shift, the input signal is an input spectrum, and the output signal is an output spectrum.

3. The method of claim 1, wherein the signal shift is determined by an approximation calculation.

4. The method of claim 1, wherein the signal shift is determined on the basis of a database.

5. The method of claim 1, further comprising:
   determining a desired signal range of the input signal and/or of the output signal of the selective switching device depending on the operation purpose of the selective switching device; and
   adding a further signal shift to the input signal and/or to the output signal as to shift the input signal and/or the output signal to the desired signal range.

6. A selective switching device configured to determine a signal shift of the selective switching device due to a current temperature in the region of the selective switching device, to add the signal shift to an input signal of the selective switching device to receive a compensated signal for which the signal shift due to the current temperature is compensated, and to remove the signal shift from an output signal of the selective switching device to receive a corrected signal for which the compensation is corrected, wherein the compensated signal and the corrected signal are synchronously updated by the selective switching device in forward direction and in reverse direction.

7. The selective switching device of claim 6, wherein the selective switching device is a frequency multiplexer in the form of a passive filter, an active filter, or a digital filter.

8. The selective switching device of claim 6, wherein the selective switching device is made of a light metal, a light metal alloy, plastic, and/or a fiber-reinforced composite.

9. A message transmission system, comprising a selective switching device that is configured to determine a signal shift of the selective switching device due to a current temperature in the region of the selective switching device, to add the signal shift to an input signal of the selective switching device to receive a compensated signal for which the signal shift due to the current temperature is compensated, and to remove the signal shift from an output signal of the selective switching device to receive a corrected signal for which the compensation is corrected, wherein the compensated signal and the corrected signal are synchronously updated by the selective switching device in forward direction and in reverse direction.

* * * * *